US007965537B2

(12) United States Patent
Breitwisch et al.

(10) Patent No.: US 7,965,537 B2
(45) Date of Patent: Jun. 21, 2011

(54) PHASE CHANGE MEMORY WITH FINITE ANNULAR CONDUCTIVE PATH

(75) Inventors: Matthew J. Breitwisch, Yorktown Heights, NY (US); Chung H. Lam, Peekskill, NY (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 12/491,816

(22) Filed: Jun. 25, 2009

(65) Prior Publication Data

US 2010/0328994 A1   Dec. 30, 2010

(51) Int. Cl.
*G11C 11/00* (2006.01)
(52) U.S. Cl. ........................................ 365/148; 365/163
(58) Field of Classification Search .................. 365/163, 365/148
See application file for complete search history.

(56) References Cited

U.S. PATENT DOCUMENTS

| 2009/0166601 A1* | 7/2009 | Czubatyj et al. | 257/3 |
| 2009/0279349 A1* | 11/2009 | Shih et al. | 365/163 |
| 2010/0110780 A1* | 5/2010 | Wicker | 365/163 |
| 2010/0163826 A1* | 7/2010 | Peters | 257/3 |

* cited by examiner

*Primary Examiner* — Hoai V Ho
(74) *Attorney, Agent, or Firm* — Ido Tuchman; Vazken Alexanian (57) ABSTRACT

A phase change memory device and a method for programming the same. The method includes determining a maximum possible resistance for the memory cells in the phase change memory device. The method includes determining a high resistance state for the memory cells in the phase change memory device. The method includes receiving a request to program a target memory cell in the phase change memory device to the high resistance state. The method also includes resetting the target memory cell in the phase change memory device to the high resistance state such that the high resistance state of the target memory cell is of less resistance than the maximum possible resistance. In one embodiment of the invention, the high resistance state for the memory cells in the phase change memory device is at least 10% less than the maximum possible resistance.

18 Claims, 7 Drawing Sheets

PHASE CHANGE MEMORY WITH FINITE ANNULAR CONDUCTIVE PATH

BACKGROUND OF THE INVENTION

1. Field of the Invention

The present invention relates to phase change memory and more specifically to the programming and fabrication of phase change memory.

2. Description of Background

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element. The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common elements in the group used to produce a chalcogenide semiconductor when creating a phase change memory cell. An example of this would be Ge2Sb2Te5 (GST), SbTe, and In2Se3.

Altering the phase change material's state requires heating the material to a melting point and then cooling the material to one of the possible states. A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state.

A problem in phase change memory is phase change material adhesion. Phase change material loses its ability to adhere to the surrounding materials when the switching volume (the region of phase change material that switches between the amorphous and crystalline phases) is in direct contact with surrounding non-phase change materials. This is due to the resultant stress caused by the expansion and contraction of the phase change material due to the different mass densities of the amorphous and crystalline phases.

SUMMARY OF THE INVENTION

An aspect of the present invention is a method for producing a phase change memory device. The phase change memory device is comprised of a plurality of memory cells. Each memory cell stores binary data represented by at least two resistance states of phase change material, with one of the resistance states being a high resistance state. The method comprises characterizing a maximum possible resistance for the memory cells. The method also includes fabricating the phase change memory device such that, during operation, the high resistance state of the memory cells is of less resistance than the maximum possible resistance.

Another aspect of the invention is a method for programming a phase change memory device. The phase change memory device is comprised of a plurality of memory cells. Each memory cell stores binary data represented by at least two resistance states of the phase change material, with one of the resistance states being a high resistance state. The method includes determining a maximum possible resistance for the memory cells. The method includes determining the high resistance state for the memory cells. The method includes receiving a request to program a target memory cell to the high resistance state. The method also includes resetting the target memory cell to the high resistance state such that the high resistance state of the target memory cell is of less resistance than the maximum possible resistance.

Yet another aspect of the invention is a phase change memory device. The phase change memory device is comprised of an array of phase change memory cells, with a target memory cell in the array of phase change memory cells. The target memory cell is configured to store binary data represented by at least two resistance states of phase change material, with one of the resistance states being a high resistance state. The phase change memory device also includes a processor configured to determine a maximum possible resistance for the array of phase change memory cells. The processor is configured to determine the high resistance state for the array of phase change memory cells. The processor is also configured to reset the target memory cell to the high resistance state such that the high resistance state of the target memory cell is of less resistance than the maximum possible resistance.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-7.

In typical phase change memory configuration, the phase change material is used to store data bits. An example of such a phase change material is Germanium-Antimony-Tellurium (GST), with the most commonly utilized stoichiometry of Ge2Sb2Te5. The phase change material may be programmed to one of at least two states: a crystalline state or an amorphous state (or somewhere in between). The crystalline state may represent a stored "0" value and the amorphous state may represent a stored "1" value. In the crystalline state, the phase change material exhibits a relatively low resistance. On the other hand, in the amorphous state, the phase change material has a relatively high resistance.

In the phase change memory configuration, altering the phase change material's state requires heating the material to a melting point and then cooling the material to one of the possible states. A current passed through the phase change material creates Joule heating and causes the phase change material to melt. Melting and gradually cooling down the phase change material allows time for the phase change material to form the crystalline state. Melting and abruptly cooling the phase change material quenches the phase change material into the amorphous state. Alternately, the phase change material may reach the crystalline phase from the amorphous phase by reaching a temperature higher than its crystallization temperature and held for a sufficient duration.

As described below, an aspect of the present invention is a method for producing a phase change memory device, with the phase change memory device includes a plurality of memory cells. The method includes characterizing a maximum possible resistance for the memory cells. The method also includes fabricating the phase change memory device such that, during operation, a high resistance state of the memory cells is of less resistance than the maximum possible resistance.

Figure 1:
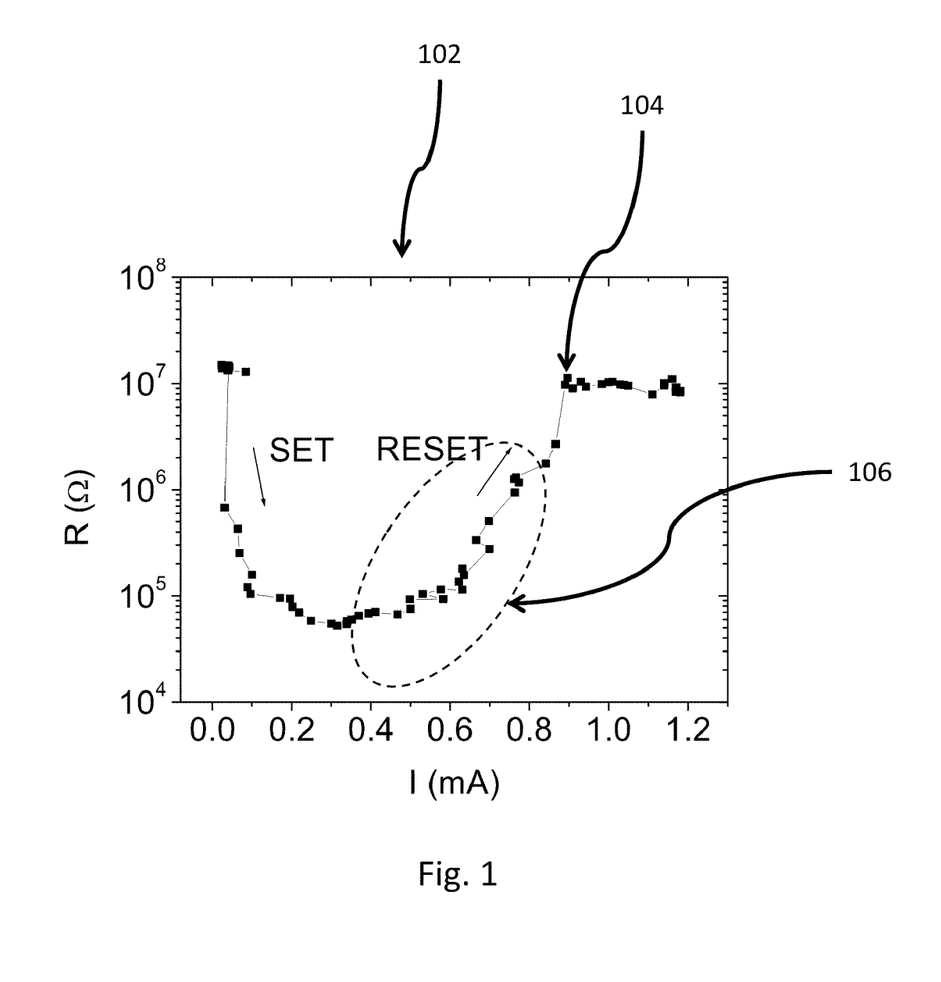
FIG. 1 illustrates a current verses resistance graph for a plurality of phase change memory cells.

FIG. 1 illustrates a current verses resistance graph 102 of a plurality of memory cells. The graph 102 shows the values of current flowing through phase change material and the resulting resistance. The directional arrows illustrate a progressively increasing current applied to "RESET" the plurality of memory cells from a "SET" state (to change the phase change material from the crystalline phase to the amorphous phase). The resistance-current graph 102 of the phase change material exhibits a somewhat parabolic shape, then plateaus after a current threshold is reached. The resistance at the plateau is the maximum possible resistance 104 of the plurality of memory cells. Note that the values on the graph 102 are illustrative and do not necessarily reflect actual measured values for a specific phase change material.

During operation of the memory cells in accordance with the present invention, a high resistance state 106 of less resistance than the maximum possible resistance 104 is used for programming the plurality of memory cells in the amorphous state. For example, if a target memory cell is to be programmed to the amorphous state (in accordance with the graph 102), a current with maximum amplitude of 0.8 mA is used instead of 0.9 mA. The high resistance state 106 is less than the maximum possible resistance 104 of the plurality of memory cells, as shown. As described below, programming the cell to the high resistance state 106 is beneficial to phase change memory cell endurance. In one particular embodiment of the invention, the high resistance state 106 is at least 10% less than the maximum possible resistance 104.

Figure 2A:
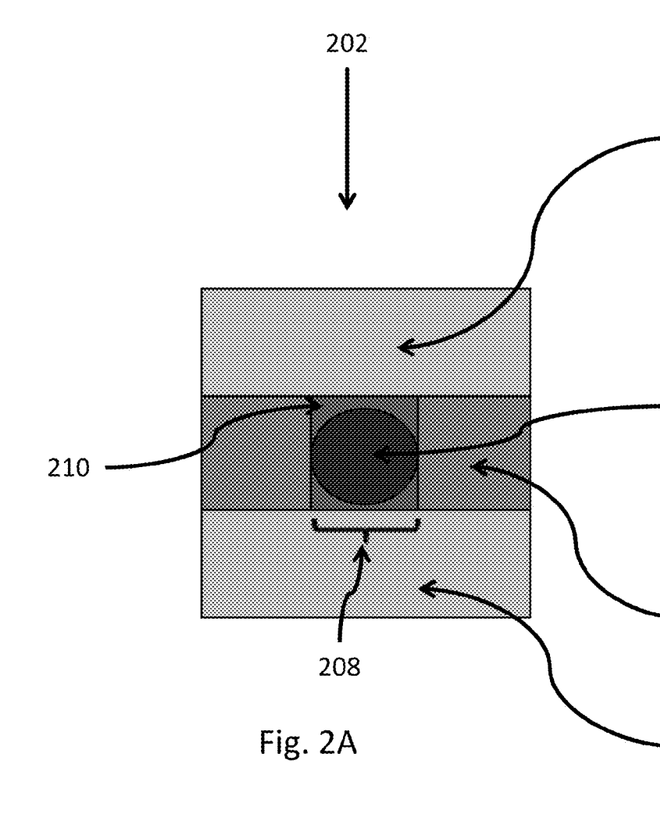
FIG. 2A and FIG. 2B illustrate embodiments of a phase change memory cell.

Now turning to FIG. 2A, a memory cell 202 programmed to the maximum possible resistance is shown. The memory cell 202 includes a bottom electrode 204, a dielectric layer 206, the phase change material 208, and a top electrode 214. The phase change material 208 shown is comprised of crystalline phase change material 210 and a volume of amorphous phase change material 212. As illustrated, when programmed to the maximum possible resistance, the volume of amorphous phase change material 210 is in physical contact with the dielectric layer 206. In some cases, the volume of amorphous phase change material 210 may also be in physical contact with the bottom electrode 204 and/or the top electrode 214. In this programming regiment, adhesion problems occur between the phase change material 208 and the surrounding materials with repeated phase change.

Figure 2B:
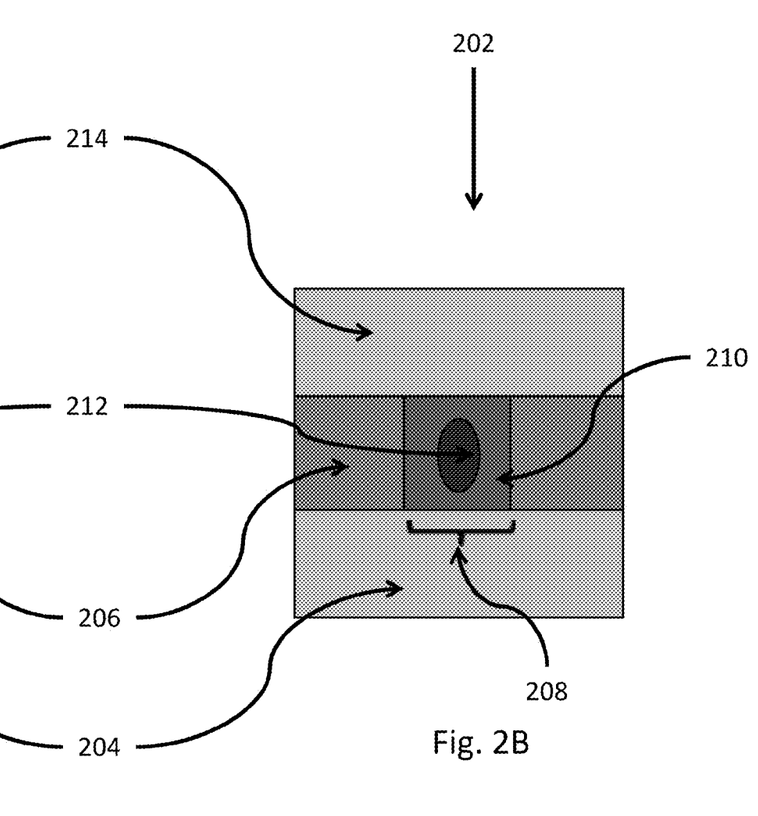

In FIG. 2B, an embodiment of the invention is illustrated. The memory cell 202 is programmed to the high resistance state that is less than the maximum possible resistance. As shown, the volume of amorphous phase change material 212 is physically separated from the dielectric layer 206, the top electrode 214, and the bottom electrode 204 by the crystalline phase change material 210. Under this programming regiment, the memory cell 202 includes an electrical conduction pathway between the top electrode 214 and the bottom electrode 204 through an annular region of the crystalline phase change material 210 surrounding the volume of amorphous phase change material 212. Those skilled in the art will appreciate that the physically separate volume of amorphous phase change material 212 helps increase cell endurance by beneficially reducing adhesion problems between the phase change material 208 and the surrounding materials.

Figure 3:
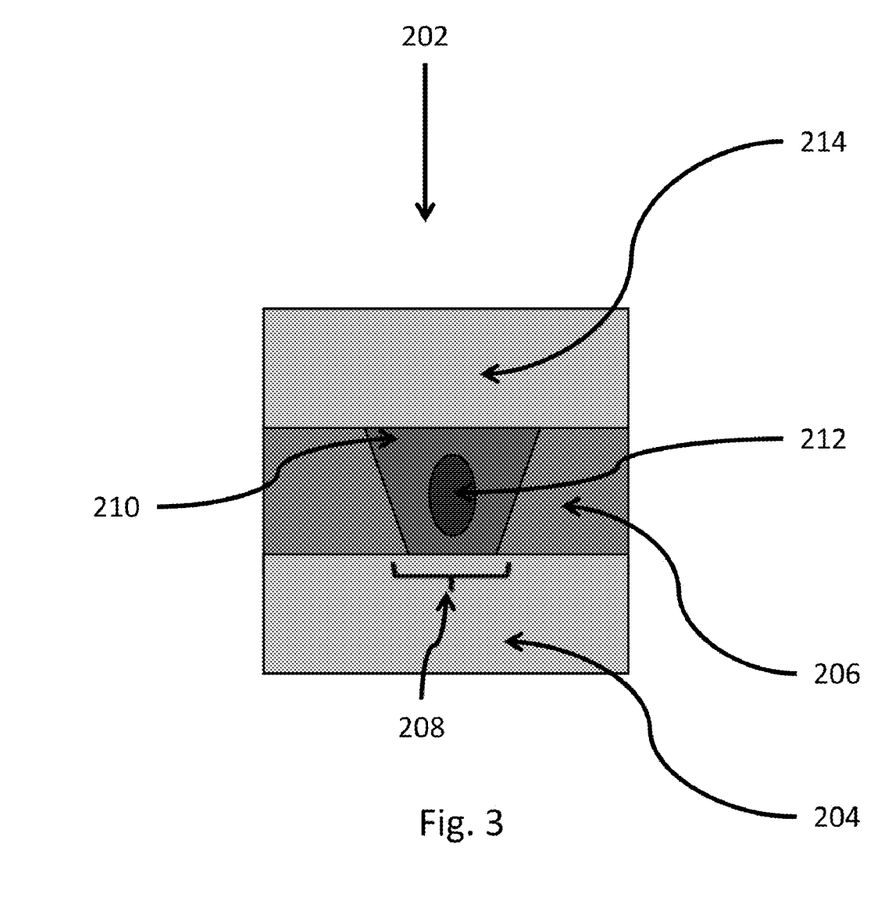
FIG. 3 illustrates an alternate embodiment of the phase change memory cell contemplated by the invention.

FIG. 3 illustrates an alternate embodiment of the memory cell 202 contemplated by the present invention. In this particular embodiment, the phase change material 208 has a trapezoidal vertical cross-section. In this phase change memory cell geometry, the crystalline phase change material 210 is afforded a greater space in separating the volume of amorphous phase change material 212 from the surrounding materials.

Figure 4:
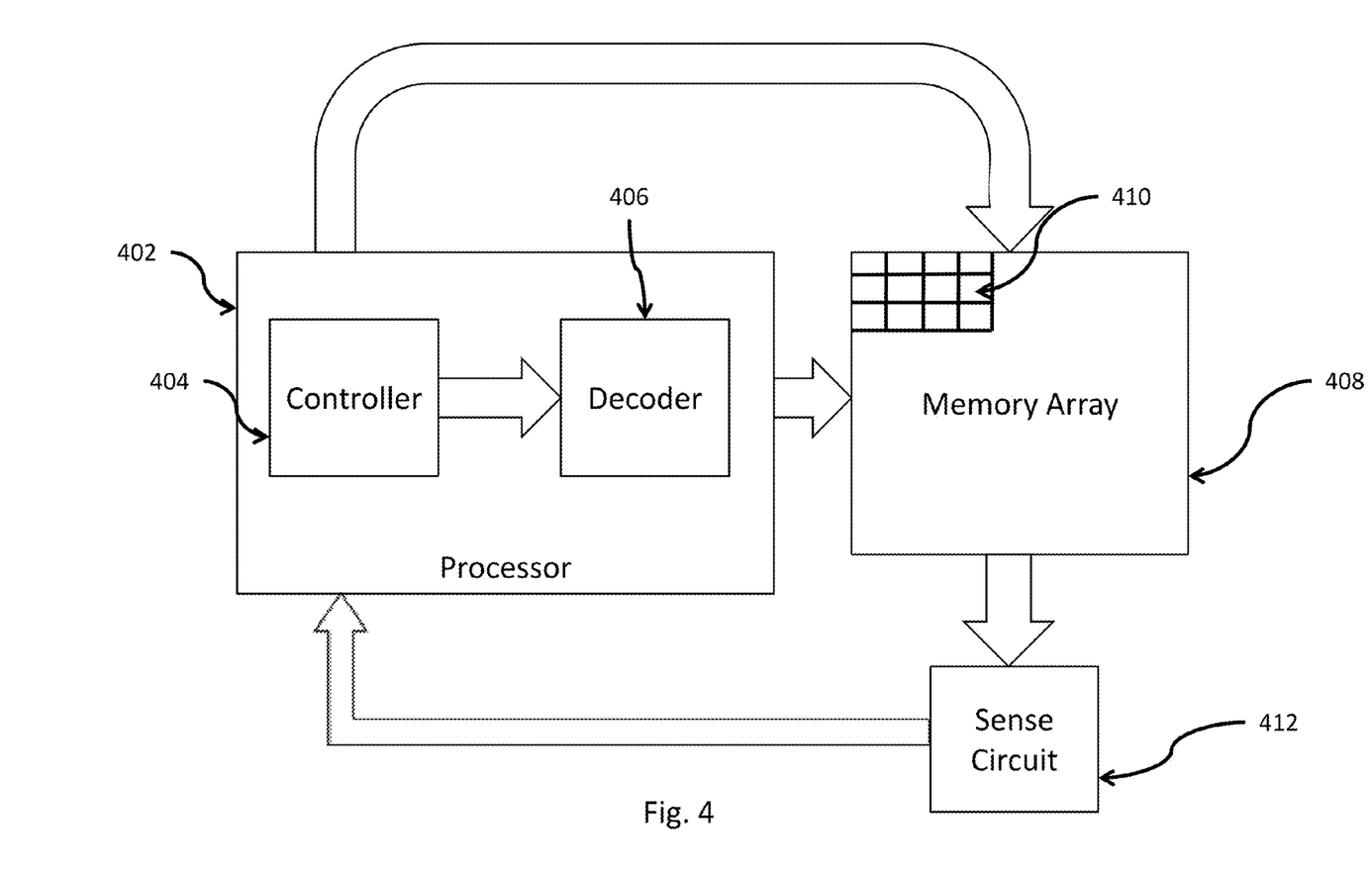
FIG. 4 illustrates a diagram of phase change memory cell programming.

In FIG. 4, a diagram illustrating a system for programming a phase change memory device contemplated by the present invention. The system includes a processor 402, a memory array 408, and a sense circuit 412. The processor 402, in one embodiment of the invention, includes a controller 404 and a decoder 406. The memory array 408 is comprised of a plurality of memory cells 410. Each memory cell 410 is configured to store binary data represented by at least two resistance states of phase change material. One of the resistance states is a high resistance state.

In one embodiment of the invention, the controller 404 in the processor 402 identifies and selects memory cells 410 in the memory array 408 for programming. The decoder 406 then decodes memory addresses from the controller 404 and applies a range of word-line biases to the memory cells 410 in the memory array 408. The sense circuit 412 senses the resistances corresponding to the currents applied. The controller 402 then determines the maximum possible resistance of the memory cells 410 in the memory array 408. The high resistance state is determined by the controller 404 and subsequent programming of the memory cells 410 uses the high resistance state for RESET write (programming the memory cells 410 to the amorphous state). As stated above, in one embodiment of the invention, the high resistance state is at least 10% less than the maximum possible resistance.

Figure 5:
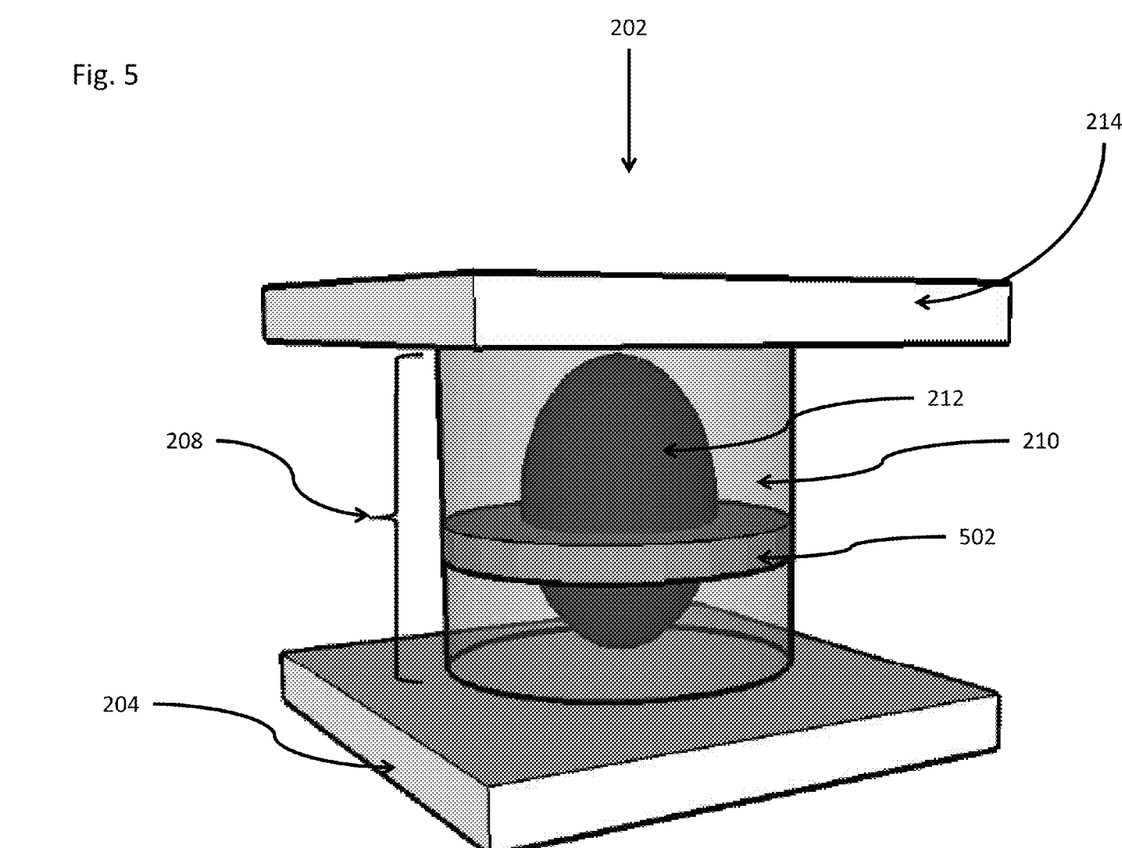
FIG. 5 illustrates an embodiment of the invention.

FIG. 5 shows a 3-dimensional view of one particular embodiment of the invention. As illustrated, a target phase change memory cell 202 is comprised of the bottom electrode 204, the dielectric layer (not shown), the phase change material 208, and the top electrode 214. The crystalline phase change material 210 surrounds the volume of amorphous phase change material 212. As shown, an annular conductive path 502 of low resistance crystalline phase change material between the amorphous phase change material 212 and the surrounding materials 208. The size of the annular conductive path 502 directly affects the resistance of the phase change memory cell 202. The smaller the annular conductive path 502, the higher the resistance, and vice versa. The presence of the annular conductive path 502 leads to greater cell endurance and increases the longevity of the memory array.

Figure 6:
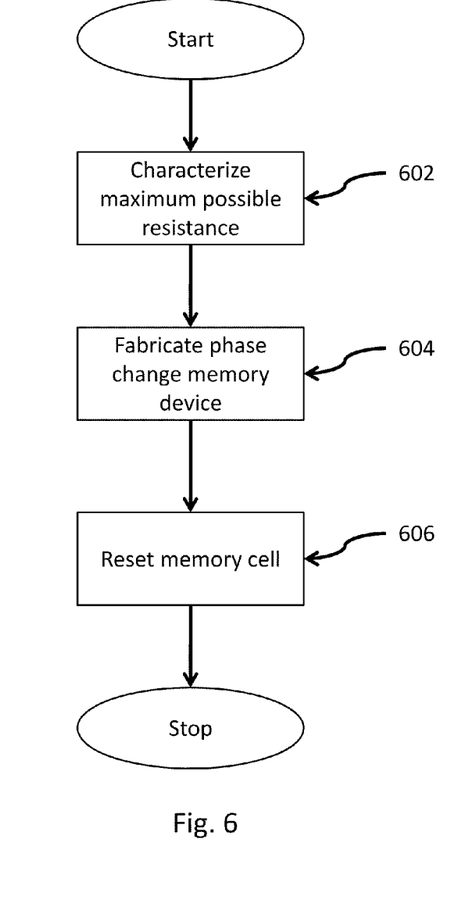
FIG. 6 is a flowchart for a method for producing a phase change memory device contemplated by the invention.

Now turning to FIG. 6, a flowchart illustrating a method for producing a phase change memory device in accordance with one embodiment of the present invention. The phase change memory device includes a plurality of memory cells. Each memory cell stores binary data represented by at least two resistance states of phase change material. One of the resistance states is a high resistance state.

The method begins at characterizing operation 602. During characterizing operation 602, a maximum possible resistance is determined for the plurality of memory cells. One method for characterizing a maximum possible resistance for the plurality of memory cells is to apply a range of word-line biases to the memory cells and to sense their corresponding resistances, as stated above. After characterizing operation 602 has been performed, control passes to fabricating operation 604.

In fabricating operation 604, the phase change memory device is fabricated such that, during operation, the high resistance state of the memory cells is of less resistance than the maximum possible resistance. In one embodiment of the invention, the high resistance state of the memory cells is at least 10% less than the maximum possible resistance. After fabricating operation 604 is completed, control passes to resetting operation 606.

During resetting operation 606, a target memory cells is RESET (programmed to the amorphous state), such that, in the high resistance state, the memory cell includes an electrical conduction pathway between a top electrode and a bottom electrode through an annular region of crystalline phase change material surrounding a volume of amorphous phase change material. In one embodiment of the invention, the volume of amorphous phase change material is physically separated from surrounding dielectric material, the top electrode, and the bottom electrode by the crystalline phase change material. Additionally, during resetting operation 606, an energy pulse is supplied to the memory cell. The energy pulse causes the creation of the volume of amorphous phase change material. After the resetting operation 606 has been completed the method ends.

Figure 7:
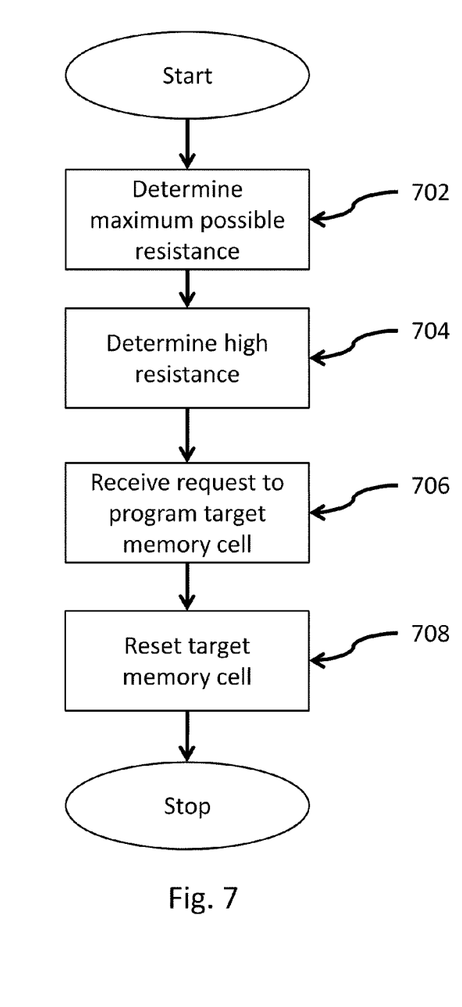
FIG. 7 is a flowchart for a method for programming a phase change memory device contemplated by the invention.

In FIG. 7, a flowchart for a method for programming a phase change memory device is shown. The phase change memory device includes a plurality of memory cells. Each memory cell stores binary data represented by at least two resistance states of phase change material, such that one of the resistance states is a high resistance state.

The control flow begins at determining operation 702. During determining operation 702, a maximum possible resistance is determined for the plurality of memory cells. After determining operation 702 is completed control passes to determining operation 704.

During determining operation 704, the high resistance state for the memory cells is determined. In one embodiment of the invention, the high resistance state of the target memory cell is at least 10% less than the maximum possible resistance. After determining operation 704 is completed control passes to receiving operation 706.

During receiving operation 706, a request to program a target memory cell to the high resistance state is received from an internal source (such as an internal processor) or an external source (such as a central processing unit). After receiving operation 706 is completed control passes to resetting operation 708.

In resetting operation 708, the target memory cell is reset to the high resistance state such that the high resistance state of the target memory cell is of less resistance than the maximum possible resistance. During resetting operation 708, the target memory cells is RESET (programmed to the amorphous state) such that, in the high resistance state, the target memory cell includes an electrical conduction pathway between a top electrode and a bottom electrode through an annular region of crystalline phase change material surrounding a volume of amorphous phase change material. The volume of amorphous phase change material is physically separated from surrounding dielectric material, the top electrode, and the bottom electrode by the crystalline phase change material. Additionally in resetting operation 708, an energy pulse is supplied to the memory cell. The energy pulse causes the creation of the volume of amorphous phase change material. After resetting operation 708 is completed, the method ends.

Those skilled in art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, manipulating signals, filtering, performing arithmetic operations, and the like.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD, or any other form of storage medium known in the art. A storage medium is coupled to the processor such that the processor can read information from, and write information to, the storage medium. In the alternative, the storage medium may be integral to the processor. The processor and the storage medium can reside in an ASIC. The ASIC can reside in a user terminal. In the alternative, the processor and the storage medium can reside as discrete components in a user terminal.

The modules can include, but are not limited to, any of the following: software or hardware components such as software object-oriented software components, class components and task components, processes, methods, functions, attributes, procedures, subroutines, segments of program code, drivers, firmware, microcode, circuitry, data, databases, data structures, tables, arrays, or variables.

Having described preferred embodiments for the method for forming a memory cell structure (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for producing a phase change memory device, the method comprising:
    characterizing a maximum possible resistance for a plurality of memory cells in the memory device, each memory cell storing binary data represented by at least two resistance states of phase change material, one of the resistance states being a high resistance state; and
    fabricating the phase change memory device such that, during operation, the high resistance state of the memory cells is of less resistance than the maximum possible resistance.

2. The method of claim 1, wherein the high resistance state of the memory cells is at least 10 percent less than the maximum possible resistance.

3. The method of claim 1, further comprising:
    resetting the memory cell such that, in the high resistance state, the memory cell includes an electrical conduction pathway between a top electrode and a bottom electrode through an annular region of crystalline phase change material surrounding a volume of amorphous phase change material.

4. The method of claim 3, wherein the volume of amorphous phase change material is physically separated from surrounding dielectric material, the top electrode, and the bottom electrode by the crystalline phase change material.

5. The method of claim 3, wherein resetting the memory cell includes supplying an energy pulse to the memory cell causing the creation of the volume of amorphous phase change material.

6. A method for programming a phase change memory device, the method comprising:
    determining a maximum possible resistance for a plurality of memory cells in the phase change memory device, each memory cell storing binary data represented by at least two resistance states of phase change material, one of the resistance states being a high resistance state;
    determining a high resistance state for the memory cells;
    receiving a request to program a target memory cell to the high resistance state;
    resetting the target memory cell to the high resistance state such that the high resistance state of the target memory cell is of less resistance than the maximum possible resistance.

7. The method of claim 6, wherein the high resistance state of the target memory cell is at least 10 percent less than the maximum possible resistance.

8. The method of claim 6, further comprising energizing the target memory cell such that, in the high resistance state, the target memory cell includes an electrical conduction pathway between a top electrode and a bottom electrode through an annular region of crystalline phase change material surrounding a volume of amorphous phase change material.

9. The method of claim 8, wherein the volume of amorphous phase change material is physically separated from surrounding dielectric material, the top electrode, and the bottom electrode by the crystalline phase change material.

10. The method of claim 8, wherein energizing the memory cell includes supplying an energy pulse to the memory cell causing the creation of the volume of amorphous phase change material.

11. A phase change memory device comprising:
    an array of phase change memory cells;
    a target memory cell in the array of phase change memory cells, the target memory cell configured to store binary data represented by at least two resistance states of phase change material, one of the resistance states being a high resistance state; and
    a processor configured to:
    determine a maximum possible resistance for the array of phase change memory cells;
    determine the high resistance state for the array of phase change memory cells; and
    reset the target memory cell to the high resistance state such that the high resistance state of the target memory cell is of less resistance than the maximum possible resistance.

12. The phase change memory device of claim 11, wherein the high resistance state of the target memory cell is at least 10 percent less than the maximum possible resistance for the array of phase change memory cells.

13. The phase change memory device of claim 11, wherein the processor is further configured to energize the target memory cell such that, in the high resistance state, the target memory cell includes an electrical conduction pathway between a top electrode and a bottom electrode through an annular region of crystalline phase change material surrounding a volume of amorphous phase change material.

14. The phase change memory device of claim 13, wherein the volume of amorphous phase change material is physically separated by the crystalline phase change material from surrounding dielectric material, the top electrode, and the bottom electrode.

15. The phase change memory device of claim 13, further comprising a driver configured to supply an energy pulse to the memory cell causing the creation of the volume of amorphous phase change material.

16. The phase change memory device of claim 11, wherein the processor is further configured to:
    apply a range of word-line biases to the memory cells; and
    measure resistances of the memory cells corresponding to the range of word-line biases.

17. The method of claim 1, wherein characterizing the maximum possible resistance for the plurality of memory cells in the memory device comprises:
    applying a range of word-line biases to the memory cells; and
    measuring resistances of the memory cells corresponding to the range of word-line biases.

18. The method of claim 6, wherein determining the maximum possible resistance for the plurality of memory cells in the phase change memory device comprises:
   applying a range of word-line biases to the memory cells; and
   measuring resistances of the memory cells corresponding to the range of word-line biases.

* * * * *